United States Patent
Okayama et al.

(10) Patent No.: US 8,815,777 B2
(45) Date of Patent: Aug. 26, 2014

(54) METAL LAMINATED SUBSTRATE FOR USE AS AN OXIDE SUPERCONDUCTING WIRE MATERIAL, AND MANUFACTURING METHOD THEREFOR

(75) Inventors: Hironao Okayama, Kudamatsu (JP); Teppei Kurokawa, Kudamatsu (JP); Kouji Nanbu, Kudamatsu (JP); Yoshihiko Isobe, Kudamatsu (JP); Takashi Koshiro, Kudamatsu (JP); Akira Kaneko, Kudamatsu (JP); Hajime Ota, Osaka (JP); Kotaro Ohki, Osaka (JP); Takashi Yamaguchi, Osaka (JP); Kazuya Ohmastu, Osaka (JP)

(73) Assignees: Toyo Kohan Co., Ltd., Tokyo (JP); Sumitomo Electric Industries, Ltd., Osaka (JP)

( * ) Notice: Subject to any disclaimer, the term of this patent is extended or adjusted under 35 U.S.C. 154(b) by 282 days.

(21) Appl. No.: 13/383,957

(22) PCT Filed: Jul. 8, 2010

(86) PCT No.: PCT/JP2010/004460
§ 371 (c)(1),
(2), (4) Date: May 1, 2012

(87) PCT Pub. No.: WO2011/007527
PCT Pub. Date: Jan. 20, 2011

(65) Prior Publication Data
US 2012/0208703 A1  Aug. 16, 2012

(30) Foreign Application Priority Data
Jul. 17, 2009  (JP) ................ 2009-169531

(51) Int. Cl.
*H01L 39/24* (2006.01)

(52) U.S. Cl.
USPC .......................................... 505/434

(58) Field of Classification Search
USPC ....................... 505/430, 434; 427/62
See application file for complete search history.

(56) References Cited

U.S. PATENT DOCUMENTS

| 6,226,858 | B1 | 5/2001 | Matsumoto et al. |
| 2008/0261072 | A1* | 10/2008 | Kashima et al. ............. 428/677 |

FOREIGN PATENT DOCUMENTS

| EP | 1982830 A2 * | 10/2008 |
| EP | 2357656 A1 | 8/2011 |
| JP | 11003620 A | 1/1999 |
| JP | 2006127847 A | 5/2006 |
| JP | 2008266686 A | 11/2008 |
| JP | 2010118246 A | 5/2010 |

* cited by examiner

*Primary Examiner* — Colleen Dunn
(74) *Attorney, Agent, or Firm* — Browdy and Neimark, PLLC

(57) ABSTRACT

A metal laminated substrate for an oxide superconducting wire is produced by removing, in a state where a copper foil to which rolling is applied at a draft of 90% or more is held at a temperature below a recrystallization temperature, an absorbed material on a surface of the copper foil by applying sputter etching to the surface of the copper foil; removing an absorbed material on a surface of a nonmagnetic metal sheet by applying sputter etching to the surface of the nonmagnetic metal sheet; bonding the copper foil and the metal sheet to each other by reduction rolls at an applied pressure of 300 MPa to 1500 MPa; orienting crystals of the copper by heating a laminated body obtained by bonding at a crystal orientation temperature of copper or above; and forming a protective layer on a copper-side surface of the laminated body by coating.

3 Claims, 4 Drawing Sheets

METAL LAMINATED SUBSTRATE FOR USE AS AN OXIDE SUPERCONDUCTING WIRE MATERIAL, AND MANUFACTURING METHOD THEREFOR

TECHNICAL FIELD

The present invention relates to a method of manufacturing a metal laminated substrate for an oxide superconducting wire and a metal laminated substrate for an oxide superconducting wire.

BACKGROUND ART

To obtain an excellent high-temperature oxide superconducting wire, it is necessary to form an intermediate layer having high crystal orientation ($CeO_2$ or zirconia doped yttrium oxide (YSZ)) and a superconducting film (RE123 film: RE: Y, Gd, Ho or the like) on a metal substrate.

As a method of forming these oxide films, conventionally, there have been known an ion-beam-assisted deposition method (IBAD method) and a RABITS method where an oxide film is formed on a metal substrate which is biaxially textured in advance.

To take future production efficiency such as a film forming speed into consideration, an oxide superconducting wire manufactured on the RABITS (biaxially textured substrate) method is advantageous. However, to enhance the superconducting property, it is important to make crystals of the metal substrate highly oriented.

As such a metal substrate, there has been disclosed a substrate where copper is laminated to a stainless steel substrate, and is biaxially textured, and an intermediate layer made of nickel is laminated to the copper layer (see patent document 1, for example).

Further, as a method of manufacturing such a metal substrate, there has been disclosed a technique where copper is subjected to high rolling reduction and is biaxially textured by heat treatment, the biaxially textured copper is laminated to a stainless steel substrate by cold rolling, and a nickel layer is laminated to the copper layer (see patent document 2, for example).

PRIOR ART DOCUMENT

Patent Document

Patent document 1: JP-A-2006-127847
Patent document 2: JP-A-2008-266686

SUMMARY OF THE INVENTION

Problems that the Invention is to Solve

However, in the manufacturing method disclosed in patent document 1, the orientation of copper laminated to the stainless steel substrate is not sufficient thus giving rise to a drawback that scratches or grooves may be formed on a surface of copper.

Further, the manufacturing method disclosed in patent document 2 adopts the means where copper is textured and, thereafter, copper is laminated to the stainless steel substrate by cold rolling. In this manner, the textured copper is rolled and hence, there may be a case where the texture of copper is degraded or scratches or grooves are formed on a surface of copper due to such rolling. Accordingly, the texture of the nickel layer, a superconducting layer or the like laminated to copper is deteriorated thus giving rise to a drawback that properties of a superconductor are declined.

It is an object of the present invention to provide a metal laminated substrate for an oxide superconducting wire, and a method of manufacturing a metal laminated substrate for an oxide superconducting wire where the above-mentioned drawbacks can be overcome, copper can be highly oriented, and the formation of scratches and grooves on a surface of copper can be prevented.

It is another object of the present invention to provide a metal laminated substrate for an oxide superconducting wire, and a method of manufacturing a metal laminated substrate for an oxide superconducting wire where copper can be laminated to the substrate while decreasing a change in copper in a reduction rolled state, and the rolled copper can be highly oriented when copper is oriented by heat treatment performed after the lamination of copper.

It is still another object of the present invention to provide a metal laminated substrate for an oxide superconducting wire, and a method of manufacturing a metal laminated substrate for an oxide superconducting wire where both the adhesion and the high orientation of copper which the substrate is required to satisfy can be simultaneously realized by controlling a pressurizing condition.

Means for Solving the Problems (1) A method of manufacturing a metal laminated substrate for an oxide superconducting wire according to the present invention includes the steps of:

removing, in a state where a copper foil to which rolling is applied at a draft of 90% or more is held at a temperature below a crystal orientation temperature, an absorbed material on a surface of the copper foil by applying sputter etching to the surface of the copper foil;

removing an absorbed material on a surface of a nonmagnetic metal sheet by applying sputter etching to the surface of the nonmagnetic metal sheet;

bonding the copper foil and the metal sheet to each other by reduction rolls at an applied pressure of 300 MPa to 1500 MPa;

biaxial texture of the copper by heating a laminate obtained by bonding at a crystal orientation temperature of copper or above; and forming a protective layer on a copper-side surface of the laminate by coating.

(2) In the method of manufacturing a metal laminated substrate for an oxide superconducting wire of the present invention having the above-mentioned constitution (1), the sputter etching of the copper foil is performed at a temperature below 150° C.

(3) In the method of manufacturing a metal laminated substrate for an oxide superconducting wire of the present invention having the above-mentioned constitution (1) or (2), in the step where the sputter etching is applied to the nonmagnetic metal sheet, the absorbed material on the surface of the substrate is removed by applying the sputter etching to the surface of the substrate in a state where the copper foil is held at a temperature below the crystal orientation temperature.

(4) A metal laminated substrate for an oxide superconducting wire according to the present invention includes:
a nonmagnetic metal sheet;
a copper layer formed on the metal sheet; and
a protective layer formed over the copper layer, wherein
a c-axis crystal orientation rate of the protective layer is 99% or more, and adhesion strength between the copper layer and the metal sheet is 0.1 N/cm or more in terms of 180° peel strength.

Advantageous Effects of the Invention

According to the present invention, the crystal orientation of copper is achieved by heat treatment after laminating copper to the substrate and hence, compared to a prior art, copper can be highly oriented so that the formation of scratches or grooves on the surface of copper can be prevented.

Further, by applying sputter etching to the surface of copper foil and the surface of the nonmagnetic metal sheet at a temperature below the crystal orientation temperature of copper, an absorbed material can be removed while keeping a crystal state of the copper foil substantially equal to a crystal state of the copper foil before etching without recrystallizing the copper foil and, at the same time, the laminated substrate can ensure sufficient adhesion while keeping a crystal state of the copper foil substantially equal to a crystal state of the copper foil before etching by controlling a rolling reduction condition. In this manner, by controlling the bonding condition, even after the copper foil is laminated to the substrate, the laminated substrate can keep the crystal state of the copper foil substantially equal to a crystal state of the copper before etching is performed and hence, crystals of copper can be highly oriented by heat treatment performed after the lamination.

BEST MODE FOR CARRYING OUT THE INVENTION

In a method of manufacturing a metal laminated substrate for an oxide superconducting wire according to an embodiment of the present invention, in a state where a copper foil to which rolling is applied at a draft of 90% or more is held at a temperature below a recrystallization temperature, an absorbed material on a surface of the copper foil is removed by applying sputter etching to the surface of the copper foil; an absorbed material on a surface of a nonmagnetic metal sheet is removed by applying sputter etching to the surface of the nonmagnetic metal sheet; the copper foil and the metal sheet are bonded to each other by reduction rolls at an applied pressure of 300 MPa to 1500 MPa; crystals of the copper are biaxially textured by heating a laminated body obtained by bonding at a recrystallization temperature or above; and a protective layer is formed on a copper-side surface of the laminated body by coating.

Figure 1:
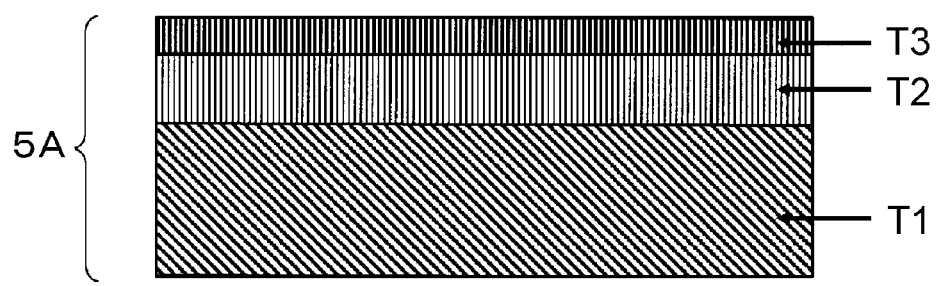
FIG. 1 is a schematic cross-sectional view showing the constitution of a metal laminated substrate for an oxide superconducting wire 5A obtained by a manufacturing method of the present invention.

FIG. 1 is a schematic cross-sectional view showing the constitution of a metal laminated substrate for an oxide superconducting wire 5A which can be obtained by the manufacturing method of the present invention.

As shown in FIG. 1, the metal laminated substrate for an oxide superconducting wire 5A is formed of a nonmagnetic metal sheet T1 which constitutes a metal substrate, a copper foil T2 (copper layer) which is laminated to the nonmagnetic metal sheet T1, and a Ni layer (protective layer) T3 which is formed on the copper foil T2 by coating.

<Nonmagnetic Metal Sheet>

As the nonmagnetic metal sheet T1, a metal sheet which plays a role of a reinforcing plate for the copper foil, forms a nonmagnetic material (anti-ferromagnetic material or paramagnetic material) at a temperature of 77K where an oxide superconducting wire is used, and has higher strength than the copper foil can be named.

Further, it is preferable that the nonmagnetic metal sheet T1 is a metal sheet in a state where the nonmagnetic metal sheet T1 is softened as much as possible, that is, the nonmagnetic metal sheet T1 is preferably formed of a so-called annealed material (O material).

The reason is that, as the copper foil which is a bonding counterpart, a copper foil which is hardened by applying cold-rolling at a high draft is used and hence, a contact area of the above-mentioned bonding boundary is ensured under pressure as low pressure as possible so that warping of the nonmagnetic metal sheet T1 after rolling can be reduced.

As a specific example of the nonmagnetic metal sheet T1, for example, an annealed material formed of a stainless steel sheet such as SUS316L can be named, and a thickness of the nonmagnetic metal sheet T1 is preferably set to 0.05 mm or more and 0.2 mm or less, for example.

The reason the thickness of the nonmagnetic metal sheet T1 is set to 0.05 m or more is to allow the nonmagnetic metal sheet T1 to ensure sufficient strength, and the reason the thickness of the nonmagnetic metal sheet T1 is set to 0.2 mm or less is to allow the nonmagnetic metal sheet T1 to have workability at the time of working a superconducting material.

<Copper Foil>

As the copper foil T2, it is preferable to use a so-called full hard material which is made of copper or a copper alloy (both copper and copper alloy referred to as a copper foil in this specification) which is subjected to cold rolling at a draft of 90% or more.

The reason the draft is set to 90% or more is that when a copper foil is subjected to cold rolling at a draft of less than 90%, there exists a possibility that Cu will not be biaxially textured in the heat treatment which is performed after rolling.

Further, from a viewpoint of strength and workability, a thickness of the copper foil T2 is preferably set to 7 μm or more and 50 μm or less.

The composition of the copper foil is preferably formed such that a Cu base is doped 100 ppm or more and by 1% or less in total of elements to be doped such as Ag, Sn, Zn, Zr, O and N.

By doping the Cu base with 100 ppm or more of these elements, the copper foil is strengthened by solid solution and, at the same time, the biaxial texture of the copper foil is improved compared to pure copper so that the copper foil can acquired the higher biaxial texture at the same draft. On the other hand, when the total doping amount of these doping elements exceeds 1%, oxides and the like are formed in the Cu base thus adversely influencing surface cleanliness. Further, there may also be a case where the crystal orientation is deteriorated.

Among the above-mentioned doping elements, the doping of Ag is particularly effective in enhancing the biaxial texture, and the doping amount of Ag is preferably set to 200 ppm to 300 ppm.

<Protective Film>

The metal laminated substrate manufactured by a manufacturing method of this embodiment is a substrate for an oxide superconducting wire and hence, an oxide intermediate layer made of $CeO_2$ or YSZ is formed on the metal laminated substrate in an oxidizing atmosphere at a high temperature of 600° C. or above in a succeeding process. When the oxide intermediate layer is directly formed on a surface of copper by coating, there may be a case where it is difficult to uniformly ensure the adhesion due to oxidation of a surface of copper. Accordingly, it is preferable that a Ni layer is formed on the surface of the copper foil by coating after the heat treatment is performed.

As a method of forming the above-mentioned Ni layer by coating, any method can be used provided that the Ni layer is epitaxially grown such that high biaxial texture of the copper foil is succeeded. However, to take productivity into consideration, an electrolytic Ni plating method is preferably used.

Any bath such as a usual watt bath, a chloride bath, a sulfamic acid bath or the like may be used as an electrolytic Ni plating bath provided that matted plating or semi-glossy plating is acquired.

Since Ni is a ferromagnetic material, a thickness of the Ni plating layer is preferably as thin as possible, and it is necessary to prevent the diffusion of metal into a base when the oxide intermediate layer is formed in a succeeding process. Accordingly, a thickness of the Ni plating layer is preferably set to 1 μm to 3 μm. The definition of Ni in this specification covers Ni alloy.

<Manufacturing Method>

In forming the metal laminated substrate for an oxide superconducting wire 5A shown in FIG. 1, the nonmagnetic metal sheet T1 and the copper foil T2 are cleaned and, thereafter, the nonmagnetic metal sheet T1 and the copper foil T2 are bonded to each other by reduction rolls.

As a cleaning method, any one of a dry method, a wet method and the combination of the dry method and the wet method may be used.

In a case where the dry method is used, treatment such as sputtering using an inert gas (Ar, Ne or the like) in a vacuum state or etching using ion beams in a vacuum state is preferably performed.

In a case where the wet method is used, the nonmagnetic metal sheet T1 and the copper foil T2 are subjected to usual sulfuric acid pickling, dipping into an alkali cleaning liquid or the like, are subjected to degreasing treatment by electrolysis and, thereafter, are cleaned with water and are dried.

Figure 5:
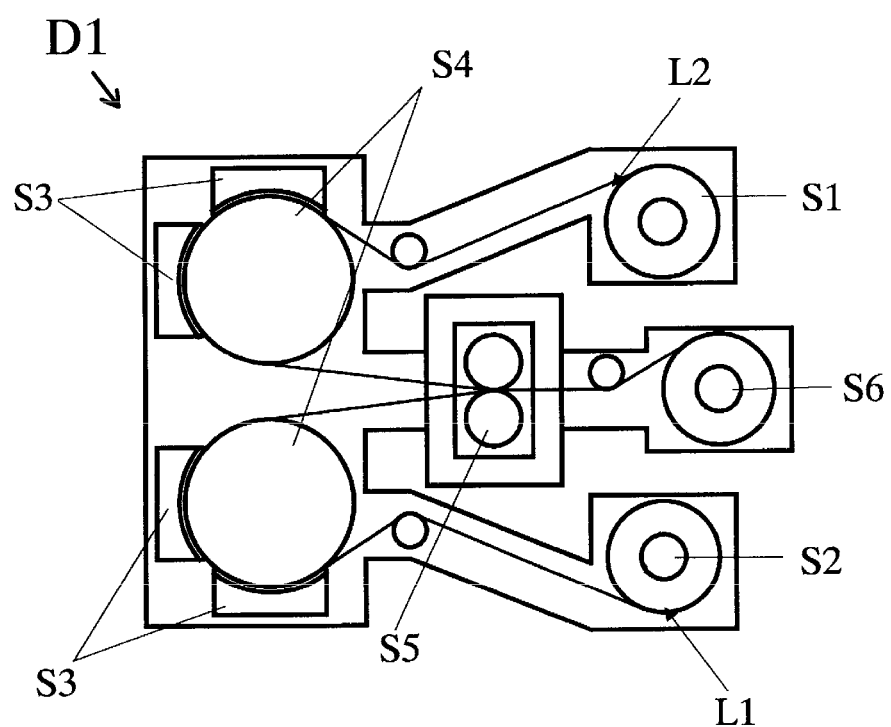
FIG. 5 is a schematic view of a surface activation bonding device used in the present invention.

To take into account productivity in bonding treatment of the metal sheet and the copper foil, it is preferable to adopt a method where, using a surface activation bonding device D1 shown in FIG. 5, dry etching of the metal sheet and the copper foil is continuously performed before reduction rolling by the reduction rolls thus removing an absorption layer or an oxide film layer on surfaces of the metal sheet and the copper foil.

As shown in FIG. 5, a nonmagnetic metal sheet L1 and a copper foil L2 are prepared as elongated coils having a width of 150 mm to 600 mm, and are mounted on recoiler portions S1, S2 of a surface activation bonding device D1 respectively. The nonmagnetic metal sheet L1 and the copper foil L2 which are conveyed from the recoiler portions S1, S2 are continuously conveyed to a surface activation treatment step where activation treatment is applied to two bonding surfaces in advance and, thereafter, the nonmagnetic metal sheet L1 and the copper foil L2 are brought into pressure contact with each other by cold rolling.

In the surface activation treatment step, the surface activation treatment is performed by applying sputter etching treatment wherein the nonmagnetic metal sheet L1 and the copper foil L2 having bonding surfaces are used as one-side electrodes A (S3) which are connected to a ground respectively, a glow discharge is generated by applying an AC current of 1 to 50 MHz between one-side electrodes A and the other-side electrodes B (S4) which are supported in an insulated manner, and an area of the electrode which is exposed in plasma generated by the glow discharge is not more than ⅓ of an area of the electrodes B. As an inert gas, argon, neon, xenon, krypton or a gas mixture containing at least one kind of gas selected from a group consisting of these gases is applicable.

In the sputter etching treatment, surfaces to be bonded of the nonmagnetic metal sheet L1 and the copper foil L2 are subjected to sputtering by an inert gas so that surface absorption layers and surface oxide films are removed whereby the bonding surfaces are activated. During this sputter etching treatment, the electrodes A (S3) take the form of cooling rolls thus preventing the elevation of temperatures of respective materials to be conveyed.

Thereafter, the nonmagnetic metal sheet L1 and the copper foil L2 are continuously conveyed to a pressure bonding roll step (S5) so that the activated surfaces are pressure-bonded to each other. When an $O_2$ gas or the like exists in the pressure bonding atmosphere, the activation processed surfaces are oxidized again during the conveyance thus influencing the adhesion. A laminated body which is formed by bonding the nonmagnetic metal sheet L1 and the copper foil L2 to each other in a close contact manner through the above-mentioned pressure bonding step is conveyed to a winding step (S6), and is wound in this step.

In the above-mentioned sputter etching step of the surface of the nonmagnetic metal sheet, although the absorbed material on the bonding surface is completely removed, it is unnecessary to completely remove a surface oxidized layer. This is because even when the oxidized layer remains on the whole surface of the nonmagnetic metal sheet, by increasing a draft in the bonding step thus exposing a base of the nonmagnetic metal sheet by making use of friction on the bonding surface, it is possible to ensure bonding property between the metal sheet and the copper foil.

Further, to completely remove an oxidized layer by dry etching, a high plasma output or etching for a long time becomes necessary so that a temperature of a material is elevated. A recrystallization start temperature of the copper foil is approximately 150° C. and hence, when the temperature of the copper foil is elevated to 150° C. or above during sputter etching treatment, the recrystallization of the copper foil occurs so that texturing of the copper foil is performed before bonding. When the biaxially textured copper foil is rolled, strain is introduced into the copper foil so that the biaxial texture of the copper foil is deteriorated. In this case, strain introduced by rolling is trivial and hence, even when heat treatment is applied to the copper foil, the copper foil cannot be biaxially textured.

Due to such a reason, in the sputter etching step, it is necessary to hold the temperature of the copper foil at a temperature below 150° C. The temperature of the copper foil is preferably held at a temperature which falls within a range of a room temperature to 100° C. or below.

Also in the treatment where sputter etching is applied to the nonmagnetic metal sheet, when the temperature of the metal sheet is elevated to 150° C. or above by performing the treatment with a high plasma output or by performing the treatment for a considerable time, there exists a possibility that the metal sheet is heated depending on a vacuum condition so that the temperature of the copper foil is elevated due to a contact between the metal sheet and the copper foil at the time of rolling whereby the recrystallization of the copper foil occurs simultaneously with the rolling thus deteriorating the biaxial texture.

Accordingly, also in the sputter etching step of the nonmagnetic metal sheet, it is desirable to hold the temperature of the metal sheet at a temperature below 150° C. The temperature of the metal sheet is preferably held at a temperature which falls within a range of a room temperature to 100° C. Although it is preferable that the degree of vacuum in this step is set high for preventing the re-absorption to the surface, it is sufficient that the degree of vacuum is set to $10^{-5}$ Pa or more and $10^{-2}$ Pa or less.

Further, the bonding between the nonmagnetic metal sheet and the copper foil is lowered due to the re-absorption of oxygen into the surface of the nonmagnetic metal sheet and into the surface of the copper foil. Accordingly, it is also preferable to perform the bonding under pressure in a non-oxidizing atmosphere, for example, in an inert gas atmosphere such as an Ar gas.

Applying of pressure by the reduction rolls is performed for ensuring an adhesion area of a bonding boundary between the nonmagnetic metal sheet and the copper foil as well as for exposing a base of the nonmagnetic metal sheet by peeling a partial surface oxidized film layer by making use of friction which occurs in the bonding boundary at the time of rolling reduction. It is preferable to apply a pressure of 300 MPa or more.

By removing the absorbed material layer by sputter etching and by applying pressure of 300 MPa or more, it is possible to acquire adhesion strength by bonding of 0.1 N/cm or more in terms of 180° peel strength.

Particularly, the metal sheet is a strength reinforcing material, and the copper foil to be laminated is also full hard and hence, both materials are hard. Accordingly, it is preferable to apply a pressure of 600 MPa or more and 1.5 GPa or less.

A pressure exceeding 1.5 GPa may be applied, and it is confirmed that the biaxial texture is not deteriorated after the heat treatment at a draft of up to 30%.

However, when the applied pressure exceeds 1.5 GPa, cracks occur on a surface of the copper foil and, at the same time, the biaxial texture of the copper foil after rolling and heat treatment is deteriorated.

After the bonding step where the copper foil and the nonmagnetic metal sheet are bonded to each other by the reduction rolls, the laminated body is subjected to heat treatment so as to texture the copper foil and hence, the copper foil T2 are biaxially textured. Thereafter, a protective layer T3 is formed on a copper-foil-T2 side surface of the laminated body. It is sufficient to set the heat treatment temperature to a temperature of 150° C. or above provided that adhesion between the copper foil and the nonmagnetic metal sheet is ensured.

In this embodiment, in the case where an annealed material formed of a stainless steel sheet is used as the nonmagnetic metal sheet, strength of the nonmagnetic metal sheet is hardly changed by heat treatment.

Further, also in the case where a rolled material to which annealing is not applied is used as the nonmagnetic metal sheet, large lowering of strength is not observed when a heat treatment time is 1 min to 10 min even at a high temperature of 600° C. or above and hence, the non-annealed rolled material also sufficiently plays a role of a strength reinforcing material.

Embodiment 1

Hereinafter, the method of manufacturing a metal laminated substrate for an oxide superconducting wire according to the present invention is explained in further detail in conjunction with embodiments.

Table 1 shows, the relationship among an Ar sputter etching time, a pressure applied by reduction rolls in a subsequent bonding step, and adhesion strength (in terms of 180° peel strength) between the bonded materials when a highly drafted copper foil having a width of 200 mm and a thickness of 18 μm and doped with 200 ppm of Ag and a stainless steel sheet made of SUS316L (annealed material) having a thickness of 100 μm are made to pass using a surface activation bonding device shown in FIG. 5.

In sputter etching, under a pressure of 0.1 Pa or less, the plasma output is set to 200 W, and a sheet passing speed is changed so as to change a time for sputtering a bonding surface.

Bonding is performed by changing a pressure applied by reduction rolls within a range of 100 MPa to 1500 MPa. Further, to confirm whether or not a temperature of copper is elevated so that the texture of copper is changed during sputter etching, the c-axis crystal orientation of the (200) plane of the post bonding sample is measured using the θ/2θ measurement in the X-ray diffraction.

Here, it is determined that the biaxial texture (recrystallization) is not generated when c-axis orientation rate of a (200) plane after bonding is within 30% and the biaxial texture (recrystallization) is generated when c-axis orientation of the (200) plane after bonding exceeds 30%.

TABLE 1

| experimental example | sputter etching time (sec) | c-axis oriented Cu (re-crystallization) after etching | applied pressure (MPa) | adhesion strength (N/cm) | remarks |
|---|---|---|---|---|---|
| comparison experimental example 1-1 | 0 | not generated | 1500 | 0 | no sputter etching |
| comparison experimental example 1-2 | 2 | not generated | 300 | 0 | insufficient removal of absorbed material |
| comparison experimental example 1-3 | 2 | not generated | 600 | 0 | |
| comparison experimental example 1-4 | 2 | not generated | 1500 | 0 | |
| comparison experimental example 1-5 | 20 | not generated | 100 | 0 | absorbed material completely removed but, oxide film remained |
| experimental example 1-1 | 20 | not generated | 300 | 0.1 | |
| experimental example 1-2 | 20 | not generated | 600 | 0.5 | |

TABLE 1-continued

| experimental example | sputter etching time (sec) | c-axis oriented Cu (re-crystallization) after etching | applied pressure (MPa) | adhesion strength (N/cm) | remarks |
|---|---|---|---|---|---|
| experimental example 1-3 | 20 | not generated | 1200 | 3.0 | |
| comparison experimental example 1-6 | 40 | generated | 600 | 1.0 | (200)crystal orientation (re-crystallization) generated |
| comparison experimental example 1-7 | 60 | generated | 600 | 5.0 | |
| comparison experimental example 1-8 | 300 | generated | 300 | 20 | absorbed material oxide film completely removed (200)crystal orientation generated in copper foil during etching |

Figure 6:
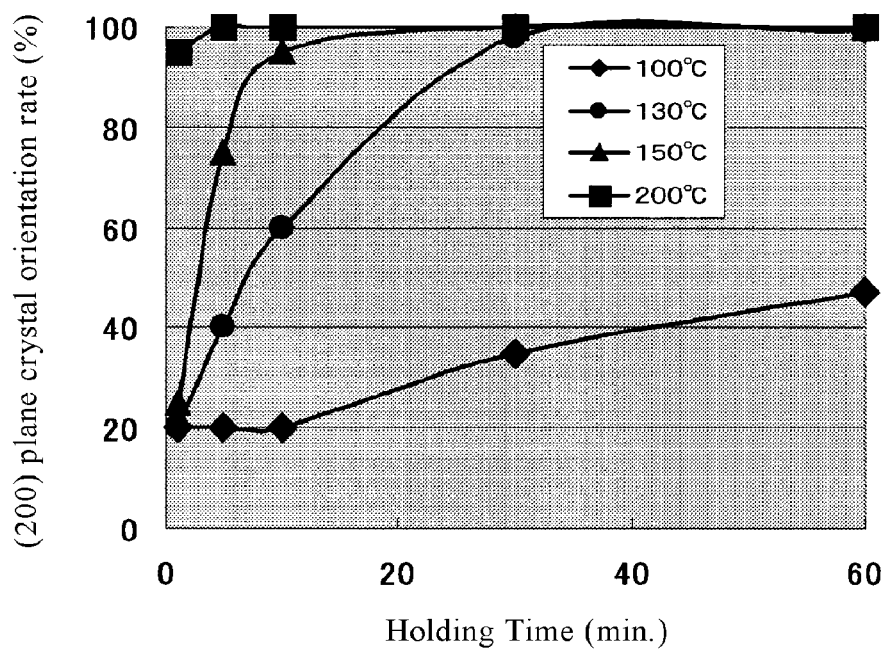
FIG. 6 is a graph showing the relationship between a crystal orientation rate and a heat treatment holding time of 0 a (200) plane of a rolled copper foil doped with 200 ppm of Ag which is used in the manufacturing method of the present invention.

Here, the reason the c-axis orientation of the (200) plane of the sample after bonding is measured using the θ/2θ measurement in the X-ray diffraction is explained in conjunction with FIG. 6.

FIG. 6 shows the relationship between the crystal orientation rate and the heat treatment holding time of a rolled copper foil (200) plane doped with 200 ppm of Ag.

After the heat treatment, the c-axis orientation rate of the (200) plane by performing the θ/2θ measurement using an X-ray diffraction apparatus is measured.

The c-axis crystal orientation indicates a rate of X-ray diffraction intensity of the (200) plane (expressed as I (200)) with respect to the total of the X-ray diffraction intensity of a (111) plane, the X-ray diffraction intensity of the (200) plane, the X-ray diffraction intensity of a (220) plane and the X-ray diffraction intensity of a (311) plane (expressed as ΣI(hkl)), and a (200) plane crystal orientation rate is expressed by a following formula.

(200) plane crystal orientation rate=$I(200)/\Sigma I \times 100(\%)$

With respect to the copper foils used in this embodiment, in a rolled state without heat treatment, the orientation rate of the (200) plane is approximately 20% to 30%.

It is understood from FIG. 6 that in the heat treatment at a temperature below 150° C., the texture of the copper foil is not changed when the heat treatment is held for only approximately 1 minute.

However, when the heat treatment is held for a period exceeding 1 minute, particularly at a temperature of 150° C. or above, the recrystallization of copper rapidly progresses so that c-axis orientation rate of the (200) plane is rapidly increased.

Based on such findings, the following can be obtained.

That is, according to the manufacturing method of the present invention, in bonding the copper foil and the metal substrate to each other, when the sputter etching is performed before bonding with a high output and a long treatment time, a copper foil temperature is elevated due to plasma and hence, the copper foil is recrystallized thus giving rise to a possibility that the texturing has been occurred before bonding.

In such a case, strain is introduced into the copper foil due to roll reduction in a rolling step so that biaxial texture is deteriorated. Even in the case where the copper foil which is once formed under a high pressure is brought into a sharp c-axis orientation state due to recrystallization, when strain is introduced into the copper foil thereafter so that the orientation of the copper foil is degraded, it is difficult to recover the biaxial texture by performing heat treatment or the like.

Accordingly, in the sputter etching, it is necessary that the heat treatment is held at least at a temperature below 150° C., and the heat treatment is performed within a time as short as possible.

Next, results on properties of laminated metal substrates made of Cu/SUS316L before Ni layer coating is formed are shown together with corresponding results of comparison examples.

The following can be understood from Table 1. That is, when sputter etching is not applied (0 second) or when sputter etching is applied for a short time of 2 seconds so that an absorbed material cannot be completely removed, adhesion is not acquired even when the applied pressure is increased up to 1500 MPa (adhesion strength=0).

This result is shown in the comparison experimental examples 1 to 4.

Further, in the case where an etching time is prolonged (20 seconds) so that an absorbed material is completely removed although an oxide film remains, the adhesion strength is hardly generated (adhesion strength=0) even when the pressure applied by reduction rolls is low, that is, 100 MPa.

This result is shown in the comparison experimental example 5.

When the applied pressure is set to 300 MPa or more, the copper foil and the stainless steel sheet adhere to each other although adhesion strength is low (adhesion strength=0.1 to 3.0), and the adhesion strength is also increased along with the increase of the applied pressure. This result is shown in the experimental examples 1 to 3.

Further, when a sputter etching time is prolonged to 40 seconds, 60 seconds or 300 seconds as in the case of the comparison experimental examples 6 to 8 so as to remove an absorbed material and a surface oxidized layer, although the adhesion strength is increased, copper generates recrystallization thereof during sputter etching thus generating the crystal orientation.

When clad roll-bonding is performed in the above-mentioned state, strain is introduced into the copper foil again so that the biaxial texture which is acquired once is deteriorated.

Here, a thickness of the copper foil used in this experiment and a thickness of an oxide film of the stainless steel sheet are measured using an Auger electron microscope before bonding and these thicknesses are 5 nm and 10 nm respectively.

With respect to an Ar sputter speed at an RF output of 200 W, sputtering of Si is measured as a standard, and sputter speeds of copper and stainless steel are obtained based on a sputtering rate.

For example, to completely remove an oxide film on a surface of the stainless steel sheet, a sputter device in this bonding device is required to perform sputtering with RF output of 200 W for 5 minutes.

In view of the above, surface states described in remarks in Table 1 are estimated surface states after sputter etching.

In performing such a sputter technique, the following document is used as reference with respect to handling of the device, the measurement of films, evaluation methods and the like.

Reference document: thin film forming technique using sputter method (practice on handling of device, measurement of films, evaluations and various applications) P. 29, Publisher: Keiei Kaihatsu center Publishing Co., Ltd. (1985)

Embodiment 2

Table 2 shows the degree of biaxial orientation of a (200) plane on a copper foil side after holding the laminated substrate made of Cu/SUS316L shown in the embodiment 1 in a non-oxidizing atmosphere at a temperature of 150° C. to 950° C. for 5 minutes to 4 hours, and the degree of biaxial orientation of a (200) plane and a c-axis crystal orientation rate of a protective layer (Ni layer) when Ni plating having a thickness of 1 μm is applied to a copper foil surface side after heat treatment together with corresponding values of comparison experimental examples.

Ni plating is performed using a usual watt bath with current density of 4 A/dm$^2$, at a bath temperature of 60° C. and with pH3. Further, with respect to the degree of biaxial orientation, pole figures of Cu(111) and Ni(111) are measured using an X-ray diffraction apparatus, and full width at half maximum $\Delta\phi$(°) of four peaks appearing at an angle α (=35°) are measured.

The following can be understood from the result shown in Table 2.

That is, even when the laminated metal sheet made of Cu/SUS316L prepared under favorable conditions shown in the embodiment 1 (sputter time: 20 seconds, applied pressure: 600 MPa) is subjected to heat treatment at a temperature of 100° C. for 1 minute, copper is not recrystallized and hence, the biaxial texture is not generated. However, when the laminated metal sheet is held at a temperature of 150° C. for 30 minutes or more or is held at a temperature higher than 150° C. for a shorter time, $\Delta\phi$ becomes 6° or less.

Particularly, when the laminated metal sheet is subjected to heat treatment at a low temperature of 150° C., by prolonging the holding time, $\Delta\phi$ is lowered, that is, the biaxial orientation is enhanced.

Further, when the laminated metal sheet is subjected to heat treatment at a high temperature for a short time, $\Delta\phi$ is lowered along with the elevation of the temperature, and the biaxial orientation is enhanced.

As a comparison example, $\Delta\phi$ of copper when the metal laminated substrates of the comparison experimental

TABLE 2

| embodiment | material | heat treatment temperature (° C.) | time (min) | $\Delta\phi$(°) of Cu | $\Delta\phi$(°) of Ni | remarks |
|---|---|---|---|---|---|---|
| comparison experimental example 2-1 | sample of experimental example 1-2 of embodiment 1 used sputter time: 20 seconds applied 600 MPa | 100 | 5 | not measured | not measured | not measured since biaxial texture is not generated in protective layer (Ni layer) |
| comparison experimental example 2-2 | | 150 | 5 | not measured | not measured | not measured since c-axis orientation rate of protective layer (Ni layer) is 80% or less |
| experimental example 2-1 | | 150 | 30 | 6.5 | 6.6 | c-axis orientation rate of protective layer (Ni layer): 99% or more |
| experimental example 2-2 | | 150 | 240 | 5.0 | 5.1 | c-axis orientation rate of protective layer (Ni layer): 99% or more |
| experimental example 2-3 | | 750 | 5 | 5.7 | 5.7 | c-axis orientation rate of protective layer (Ni layer): 99% or more |
| experimental example 2-4 | | 850 | 5 | 5.6 | 5.6 | c-axis orientation rate of protective layer (Ni layer): 99% or more |
| experimental example 2-5 | | 950 | 5 | 5.3 | 5.3 | c-axis orientation rate of protective layer (Ni layer): 99% or more |
| comparison experimental example 2-3 | sample of comparison experimental example 1-6 of embodiment 1 used sputter time: 40 seconds applied pressure: 600 MPa | 150 | 240 | 6.8 | 7.0 | |
| comparison experimental example 2-4 | | 750 | 5 | 6.7 | 7.4 | c-axis orientation rate of protective layer (Ni layer): 80% or less |
| comparison experimental example 2-5 | | 850 | 5 | not measured | not measured | not measured since c-axis orientation rate of protective layer (Ni layer) is 60% or less | examples 1-6 (sputter time: 40 seconds, applied pressure: 600 MPa) described in the embodiment 1 are subjected to heat treatment is also indicated.

In this sample, the biaxial texture is generated once before bonding and, thereafter, the pressure of 600 MPa is applied to the sample in the bonding step and hence, strain is introduced into the copper foil.

Accordingly, even after the heat treatment is finished, the biaxial orientation is deteriorated and Δϕ exhibits a value of 6° or more.

Further, when the sample is subjected to heat treatment at a relatively high temperature of 850°, the secondary recrystallization is generated due to the introduction of strain and hence, the texture largely collapses.

<Modifications of the Present Invention>

Hereinafter, modifications manufactured using the manufacturing method of the present invention are described.

Figure 2:
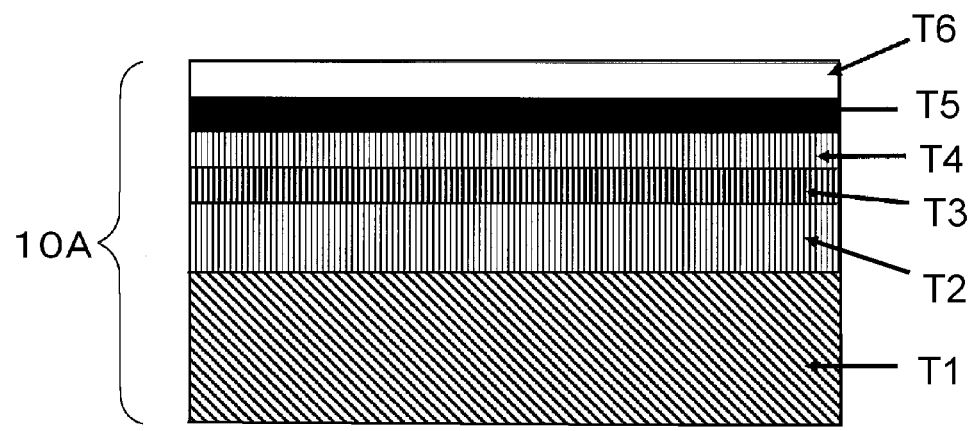
FIG. 2 is a schematic cross-sectional view showing the constitution of an oxide superconducting wire 10A according to an embodiment of the manufacturing method of the present invention.

FIG. 2 is a schematic cross-sectional view showing the constitution of an oxide superconducting wire 10A where an intermediate layer T4, an oxide superconducting layer T5, a protective film T6 are stacked in order on a metal laminated substrate for an oxide superconducting wire 5A shorn in FIG. 1.

The oxide superconducting wire 10A is manufactured in such a manner that an intermediate layer made of $CeO_2$, YSZ, $SrTiO_3$, MgO or the like is formed on a protective layer T3 as a film in an epitaxial manner using a sputter method or the like, the superconducting layer formed of a Y123 based thin film or the like is formed as a film by a laser ablation method or the like, and a layer made of Ag, Cu or the like is further laminated to the superconducting layer as the protective film.

Figure 3:
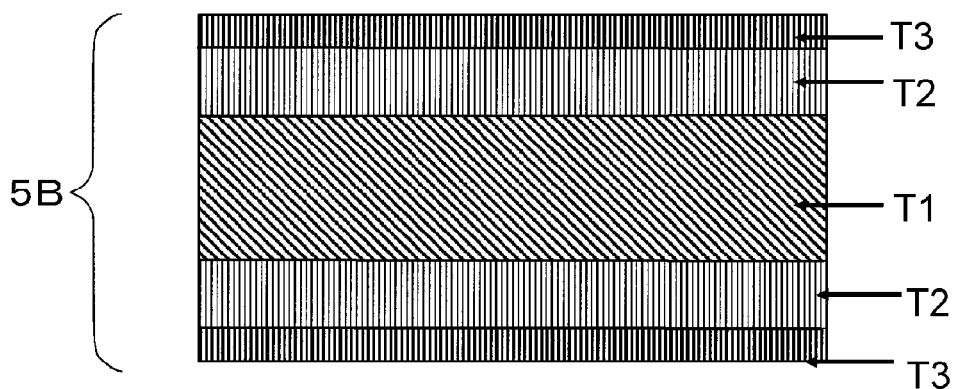
FIG. 3 is a schematic cross-sectional view showing the constitution of a metal laminated plate for an oxide superconducting wire 5B according to an embodiment of a manufacturing method of the present invention, wherein a copper foil T2 is laminated to both surfaces of a nonmagnetic metal sheet T1 by surface activation bonding and, after heat treatment, a protective layer T3 made of Ni is formed on both surfaces by coating.

FIG. 3 is a schematic cross-sectional view showing the constitution of a metal laminated plate for an oxide superconducting wire, that is, a metal laminated plate for an oxide superconducting wire 5B which is formed by laminating a copper foil T2 to both surfaces of a nonmagnetic metal sheet T1 by surface activation bonding and, after heat treatment, by applying a protective layer T3 formed of a Ni layer to both outer surfaces of the copper foils T2 by coating.

Figure 4:
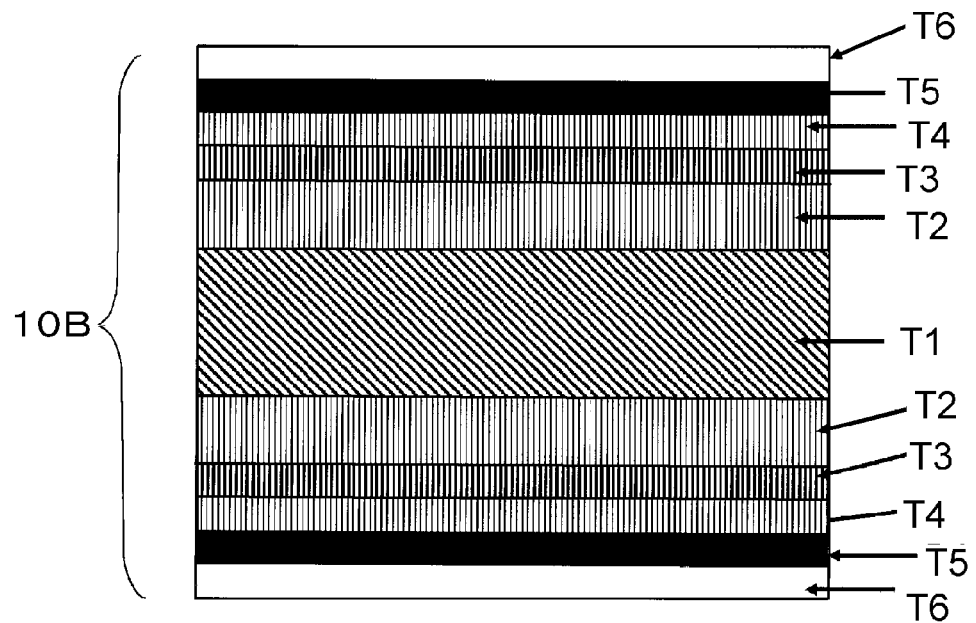
FIG. 4 is a schematic cross-sectional view showing the constitution of an oxide superconducting wire 10B according to an embodiment of the manufacturing method of the present invention.

FIG. 4 is a schematic cross-sectional view showing the constitution of an oxide superconducting wire 10B which uses the metal laminated plate for an oxide superconducting wire shown in FIG. 3.

Industrial Applicability

According to the present invention, the copper is biaxially textured by applying heat treatment after copper is laminated to the substrate. Accordingly, compared to the prior art, copper can be highly oriented so that the formation of scratches or grooves on the surface of copper film can be prevented. According to the present invention, by performing sputter etching of copper while holding a temperature below a crystallization start temperature of copper, the copper film can be laminated to the substrate with a smaller change in copper in a draft state compared to the prior art so that copper can have sharp biaxial texture compared to the prior art when copper which is reduced by rolling reduction is oriented by the heat treatment after the rolling reduction. Further, sputter etching of copper is performed while holding the temperature below the crystallization start temperature of copper and hence, there exists a high possibility that an oxidized layer remains on the surface of copper. Although adhesion between copper and the substrate is liable to be lowered in the case of the prior art, the present invention can realize both an adhesive force and the sharp biaxial texture of copper which the substrate is required to satisfy simultaneously by controlling the pressure applying condition whereby the present invention has extremely high industrial applicability.

| Description of Reference Numerals and Signs | |
|---|---|
| T1, L1 | nonmagnetic metal sheet |
| T2, L2 | copper foil |
| T3 | protective layer (Ni layer) |
| T4 | intermediate layer |
| T5 | oxide superconducting layer |
| T6: | protective film |
| D1 | surface activation bonding device |
| S1, S2: | recoiler portion |
| S3 | electrode A |
| S4 | electrode B |
| S5 | pressure bonding roll step |
| S6 | winding step |
| 5A | metal laminated substrate |
| 5B | metal laminated sheet |
| 10A, 10B | oxide superconducting wire |

The invention claimed is:

1. A method of manufacturing a metal laminated substrate for an oxide superconducting wire, the method comprising the steps of:
removing, in a state where a copper foil to which rolling is applied at a draft of 90% or more is held at a temperature below a recrystallization temperature, an absorbed material on a surface of the copper foil by applying sputter etching to the surface of the copper foil;
removing an absorbed material on a surface of a nonmagnetic metal sheet by applying sputter etching to the surface of the nonmagnetic metal sheet;
bonding the copper foil and the metal sheet to each other by reduction rolls at an applied pressure of 300 MPa to 1500 MPa;
orienting crystals of the copper by heating a laminated body obtained by the bonding at a crystal orientation temperature of copper or above; and
forming a protective layer on a copper-side surface of the laminated body by coating.

2. A method of manufacturing a metal laminated substrate for an oxide superconducting wire according to claim 1, wherein the sputter etching of the copper foil is performed at a temperature below 150° C.

3. The method of manufacturing a metal laminated substrate for an oxide superconducting wire according to claim 1, wherein in the step where the sputter etching is applied to the nonmagnetic metal sheet, the absorbed material on the surface of the substrate is removed by applying the sputter etching to the surface of the substrate in a state where the copper foil is held at a temperature below the recrystallization temperature.

* * * * *